US006991474B1

(12) United States Patent
Ju

(10) Patent No.: US 6,991,474 B1
(45) Date of Patent: Jan. 31, 2006

(54) ELECTRICAL CONNECTOR

(76) Inventor: Ted Ju, P.O. Box 26-757, Taipei 106 (TW)

(*) Notice: Subject to any disclaimer, the term of this patent is extended or adjusted under 35 U.S.C. 154(b) by 0 days.

(21) Appl. No.: 11/036,725

(22) Filed: Jan. 18, 2005

(51) Int. Cl.
*H01R 12/60* (2006.01)
(52) U.S. Cl. .......................................... 439/73; 439/331
(58) Field of Classification Search .................. 439/73, 439/331, 342, 70, 71, 330, 260, 261
See application file for complete search history.

(56) References Cited

U.S. PATENT DOCUMENTS 4,502,747 A * 3/1985 Bright et al. ............... 439/296
5,161,984 A * 11/1992 Taylor et al. ................. 439/73
5,213,531 A * 5/1993 Matsuoka et al. .......... 439/331
5,364,286 A * 11/1994 Matsuoka ................... 439/330
6,368,137 B1 * 4/2002 Orwoll ....................... 439/331
6,464,515 B1 * 10/2002 Wu ........................... 439/108
6,780,025 B2 * 8/2004 Ma et al. ...................... 439/73
6,827,587 B2 * 12/2004 Ma ............................ 439/73

* cited by examiner

*Primary Examiner*—Hien Vu
(74) *Attorney, Agent, or Firm*—Rosenberg, Klein & Lee

(57) ABSTRACT

An electrical connector includes an insulating housing having a frame and a plurality of slots formed thereof; a plurality of contacts receiving in the slots partially and having a contacting portion higher than the slots; a pair of levers having an operation portion, a shaft portion and a press portion; and at least one metallic orientation member secured at the shaft portion thereof for rotating the operation portion to enable the press portion downwardly so as to force a chip module, thus the chip module electrically connecting the contacts.

5 Claims, 5 Drawing Sheets

ELECTRICAL CONNECTOR

BACKGROUND OF THE INVENTION

1. Field of the Invention

The present invention relates to an electrical connector, and particularly relates to an electrical connector adapting for a BGA (Ball Grid Array) chip.

2. Background of the Invention

As the application of the multimedia, the communication and the computer technologies develop; the desk or laptop computer functions more powerful and the design of the circuit are more complicated. Particularly for the arrangement of pluralities of components in a laptop computer with limited size, the design of the circuit and the arrangement of the components are much emphasized.

The conventional electrical connector discloses a semiconductor packaging assembly, which includes a land grid array socket adapting for a circuit board for an electrical connection, a land grid array module having a substantially flat carrier member having electrical contact with said socket, said carrier member also including a semiconductor die disposed on top of said carrier member so as to leave exposed a top portion of said carrier member substantially surrounding said die; a supporting frame engaging to the circuit board and having a supporting member disposed therein; at least two press levers connecting the supporting member to lift the carrier member upwardly in a rotation manner; and a resilient arm disposed on the supporting member contacting the press levers for upward movements.

However, the supporting frame and the socket are engaged with each other, when the lever rotates upwardly, the supporting frame is forced to warp upwardly, so as to enable the socket warp for disconnection or break. Furthermore, the connectional socket is complicated and difficult to process.

Hence, an improvement over the prior art is required to overcome the disadvantages thereof.

SUMMARY OF INVENTION

An electrical connector is provided with a simple structure and a guaranteed connection between a chip module and a circuit board.

An electrical connector includes an insulating housing having a frame and a plurality of slots formed thereof; a plurality of contacts receiving in the slots partially and having a contacting portion higher than the slots; a pair of levers having an operation portion, a shaft portion and a press portion; and at least one metallic orientation member secured at the shaft portion thereof for rotating the operation portion to enable the press portion downwardly so as to force a chip module, thus the chip module electrically connecting the contacts.

Comparing to the conventional socket, the shaft portion according to the present invention is secured by the metallic member, and the metallic member has an opposing end soldered to the circuit board. Thus, there is no direct connection between the shaft portion and the insulating housing. When the lever rotates the shaft portion will not force to the insulating housing so as to avoid warping or breaking. Furthermore, the electrical connector has a simple structure and easy to make.

To provide a further understanding of the invention, the following detailed description illustrates embodiments and examples of the invention. Examples of the more important features of the invention thus have been summarized rather broadly in order that the detailed description thereof that follows may be better understood, and in order that the contributions to the art may be appreciated. There are, of course, additional features of the invention that will be described hereinafter which will form the subject of the claims appended hereto.

BRIEF DESCRIPTION OF THE DRAWINGS

These and other features, aspects, and advantages of the present invention will become better understood with regard to the following description, appended claims, and accompanying drawings, where:

DETAILED DESCRIPTION OF THE EMBODIMENTS

Figure 1:
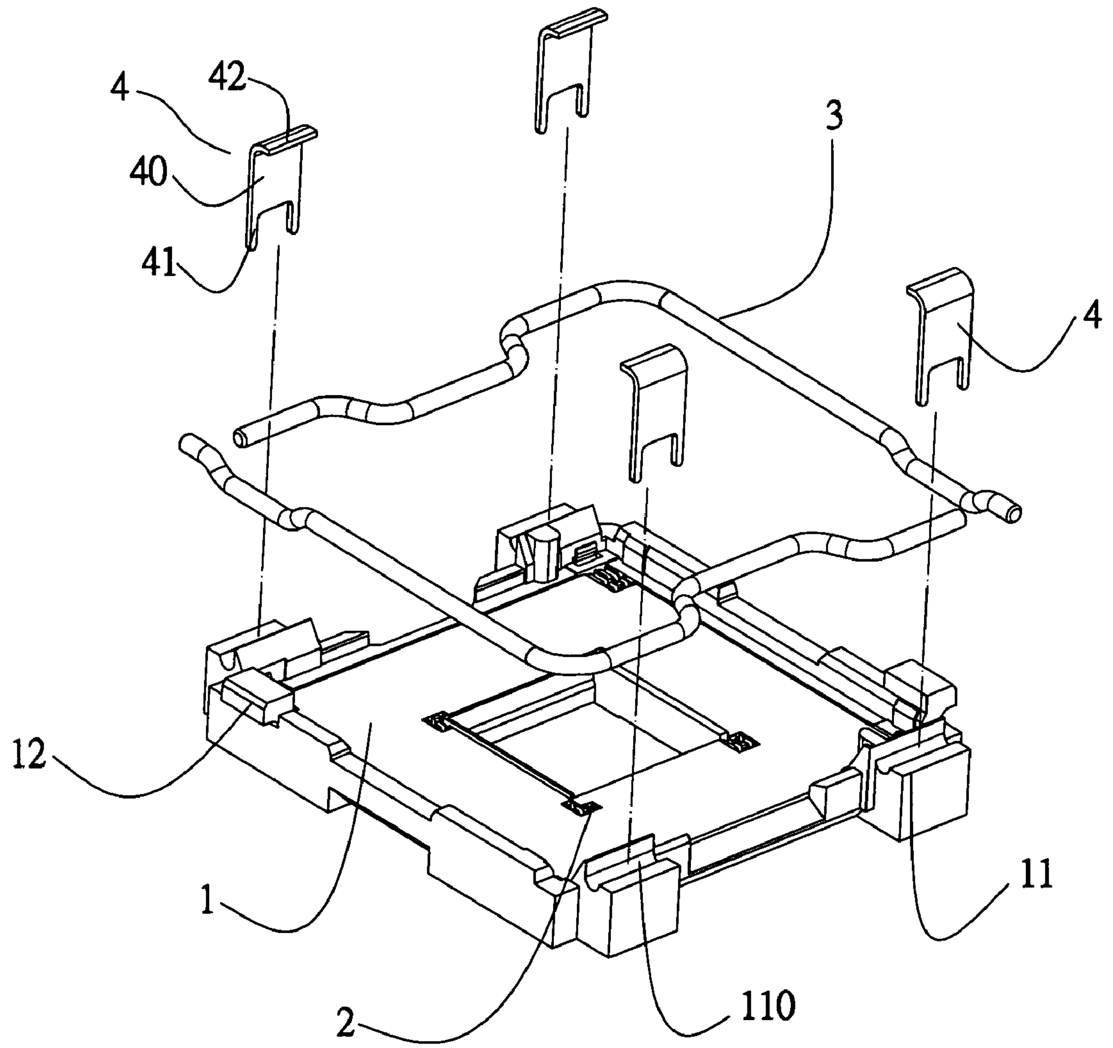
FIG. 1 is a decomposition view of an electrical connector according to the present invention.
Figure 2A:
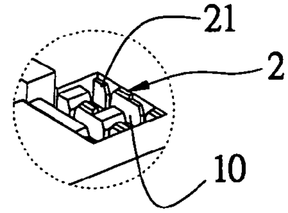
FIG. 2A is an enlarged view of an embodiment of a metallic member disposed in the electrical connector according to FIG. 2.
Figure 2:
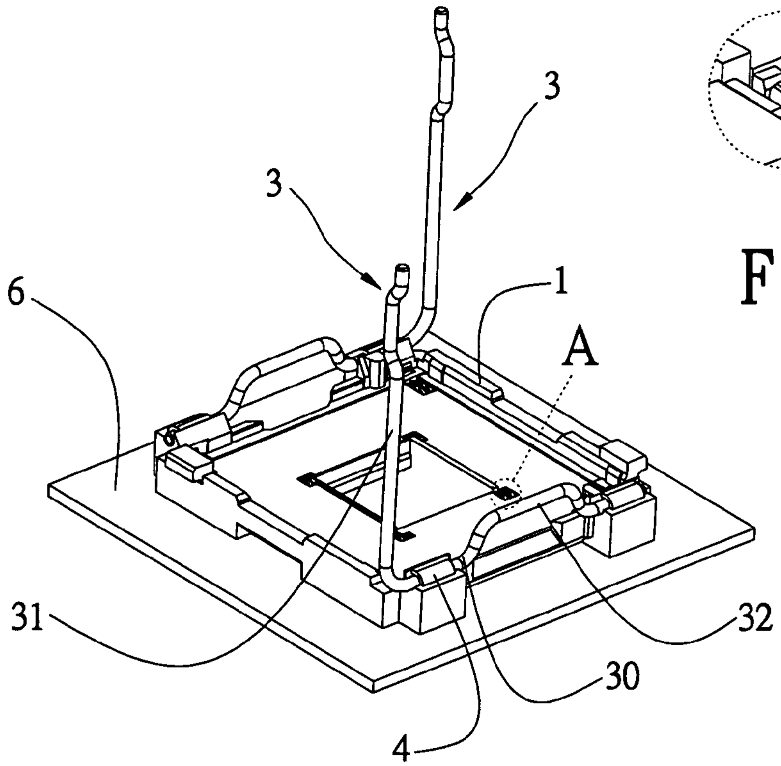
FIG. 2 is a perspective view of the electrical connector connecting a circuit board according to the present invention.
Figure 3:
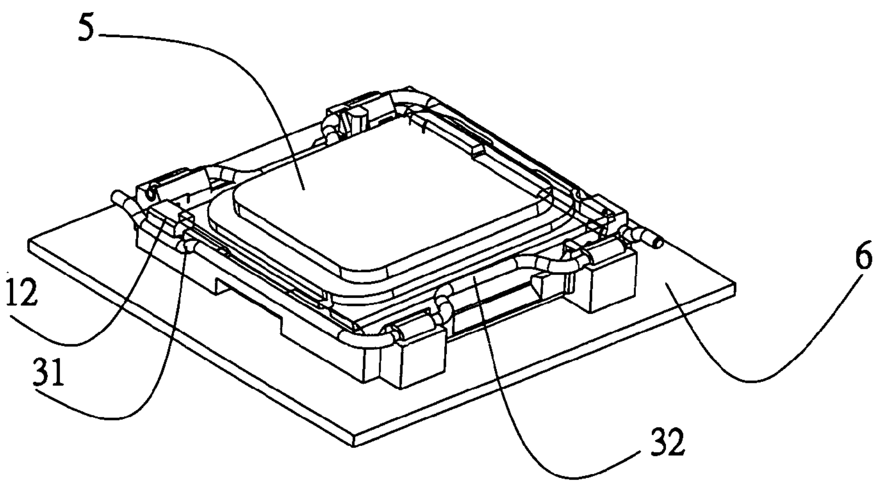
FIG. 3 is a decomposition view of a card edge connector connecting the circuit board and a chip module according to the present invention.

With respect to FIGS. 1 to 3, an electrical connector according to the present invention includes an insulating housing 1 having a frame and a plurality of slots 10 formed thereof; a plurality of contacts 2 receiving in the slots 10 partially and having a contacting portion 21 higher than the slots 10; a pair of levers 3 having an operation portion 31, a shaft portion 30 and a press portion 32; and at least one metallic orientation member 4 secured at the shaft portion 30 thereof for rotating the operation portion 31 to enable the press portion 32 downwardly so as to force a chip module 5, thus the chip module 5 electrically connecting the contacts 2. Therefore, the chip module 5 electrically connects a circuit board 6. The frame has an orientation border 11 projected upwardly therefrom for orientating the chip module 5. The orientation border 11 has a plurality of receiving slots 110 formed on an upper surface thereof, and a plurality of vertical passages communicating the receiving slots 110 for inserting the metallic orientation member 4. In addition, the insulating housing 1 has a protrusion 12 projected outwardly from a side thereof.

The metallic orientation member 4 has a sheet shape, and includes an orientation portion 40, a solder portion 41 vertically extending downwardly from the orientation portion 40, and a bent portion 42 extending laterally from the orientation portion 40. The solder portion 41 penetrates through the insulating housing 1 and exposes out of a lower surface thereof for inserting and soldering a hole of the circuit board 6. The orientation portion 40 is disposed inside the receiving slots 110, and the bent portion 42 has a configuration mating with the receiving slots 110. The operation portion 31 is substantially extending to the shaft portion 30, and the press portion 32 extending from a middle portion of the shaft portion 30. The bent portion 42 of the orientation metallic member 4 can limit the shaft portion 30 along a vertical direction thereof. When the press portion 32 forces the chip module 5, the operation portion 31 has an end 310 engaging with the protrusion 12 of the insulating housing 1. Thus, the contacts 2 can electrically connect the chip module 5.

The two levers 3 are symmetrically arranged along the insulating housing 1, when the chip module 5 connects the electrical connector, the chip module 5 only needs to be disposed in the insulating housing 1, the press portion 32 of the lever 3 ca presses an upper surface of the chip module 5 to practice the compression contact between the chip module 5 and the contacts 2.

Figure 4:
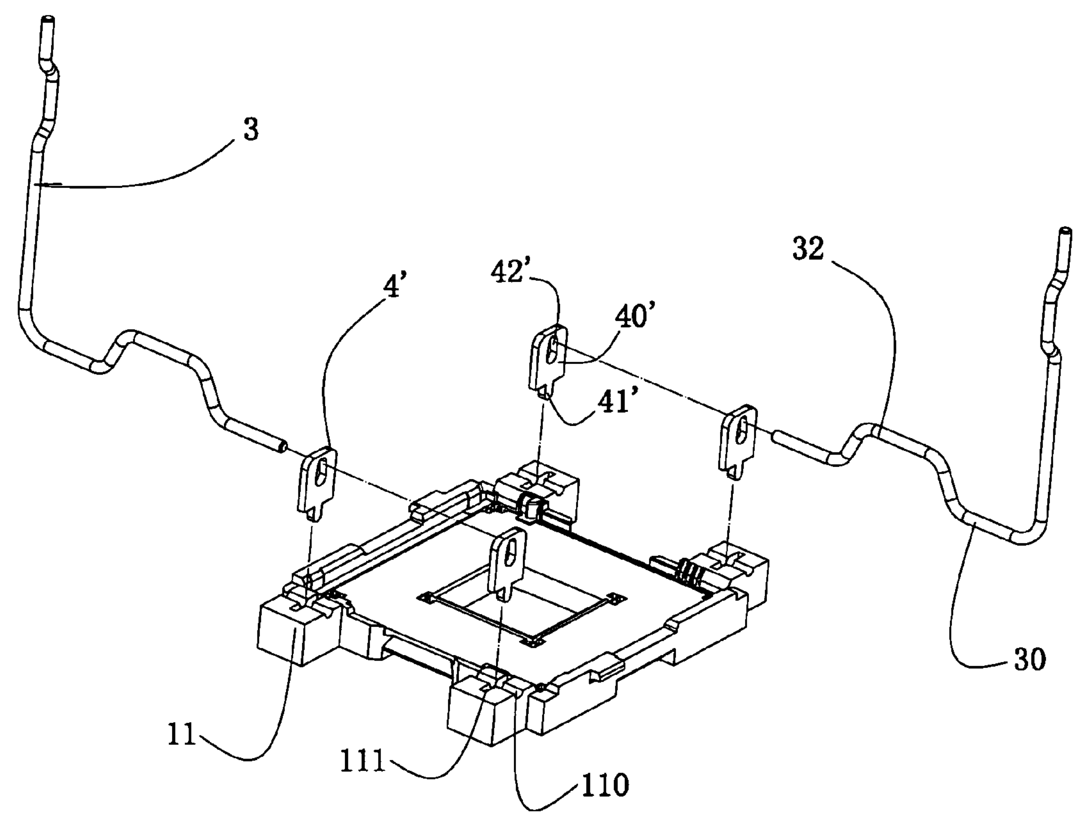
FIG. 4 is a perspective view of another embodiment of a metallic member disposed in the electrical connector according to the present invention.
Figure 5:
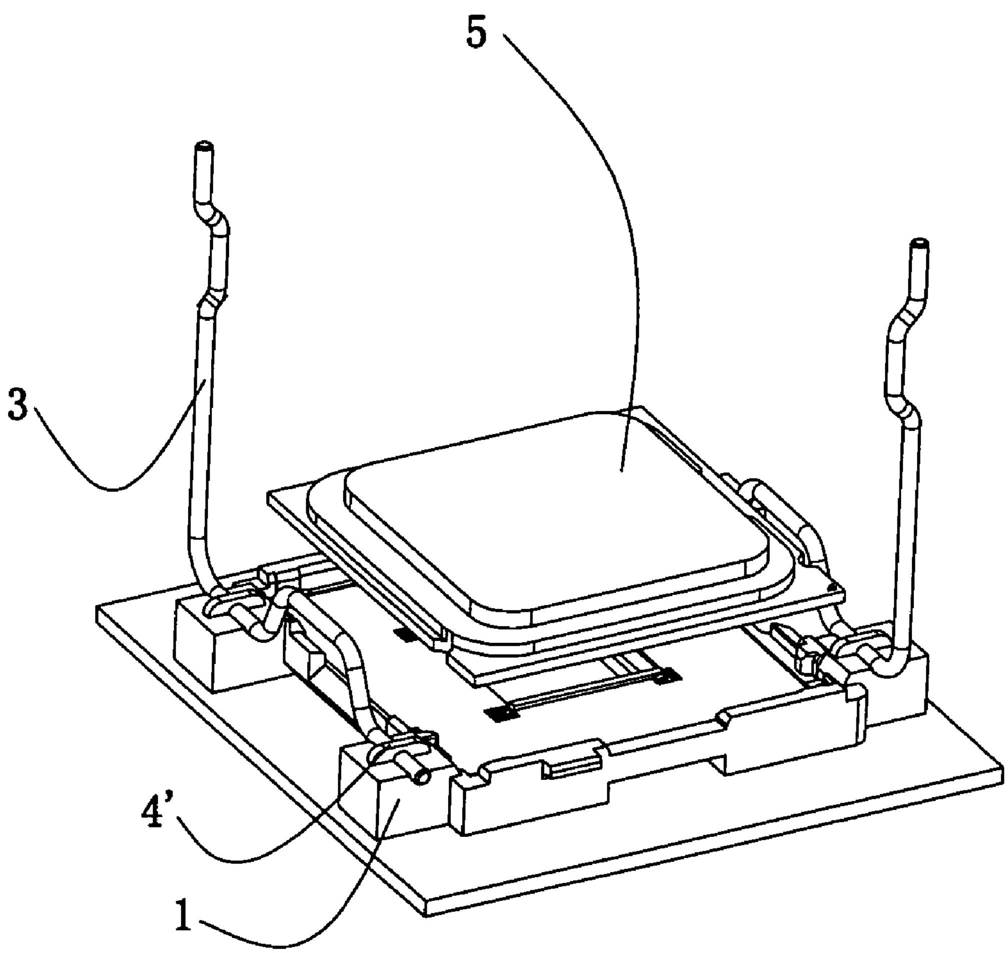
FIG. 5 is a perspective view of the electrical connector according to FIG. 4 connecting the circuit board and the chip module.
Figure 6:
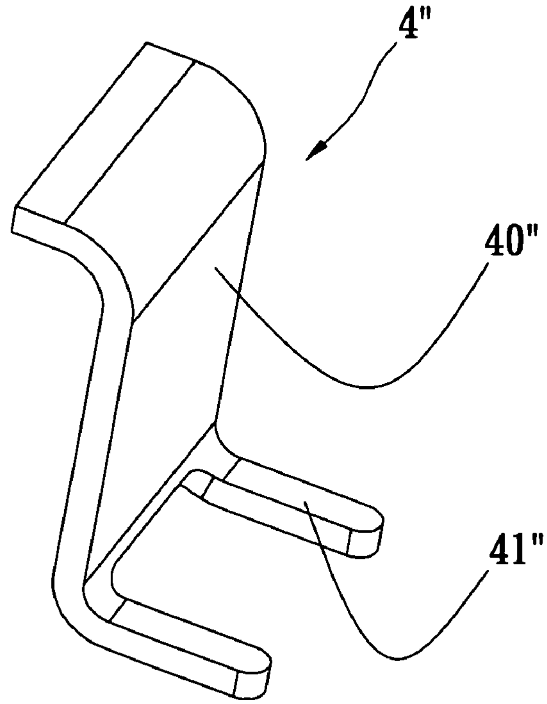
FIG. 6 is a perspective view of a further embodiment of the metallic member disposed in the electrical connector according to the present invention.
Figure 7:
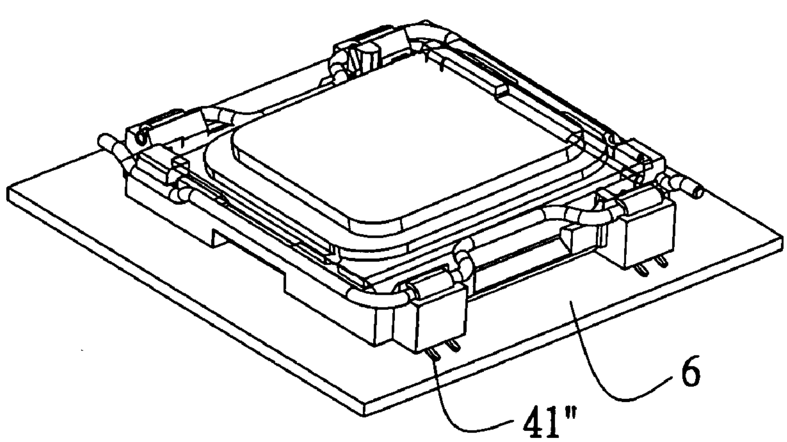
FIG. 7 is a perspective view of the electrical connector according to FIG. 6 connecting the circuit board and the chip module.

Illustrated in FIGS. 4 and 7, the orientation metallic member 4 can be another shape, the orientation metallic member 4 is substantially sheet. Referring to FIG. 4, the orientation portion 40' has a through hole 42' for receiving the shaft portion 30 and the press portion 32, the insulating housing 1 has a slit 111 substantially vertical to the receiving slots 110 and formed at an upper surface thereof for receiving the metallic member 4', and the slit 111 is formed from the upper surface to the lower surface of the insulating housing 1. Therefore, the solder portion 41' can extends out of the lower surface of the insulating housing 1 for electrically connecting the circuit board 6. Of course, the solder portion 41" can be extended from a lower end of the orientation portion 40", illustrated in FIG. 6, for soldering to the circuit board 6 by SMT. In addition, the contacts 2 can have a lower end shaped like a needle for penetrating through the circuit board 6 in order to solder to the lower surface thereof.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. An electrical connector comprising:

an insulating housing having a frame and a plurality of slots formed therein;

a plurality of contacts respectively partially received in the slots and having a contacting portion disposed above the slots;

a pair of levers respectively pivotally coupled to opposing ends of the frame in order to simultaneously apply a downward force to a chip module, each of the pair of levers having an operation portion for rotatively displacing the lever, a shaft portion forming a rotative axis of the lever and a press portion for applying the downward force to a corresponding end of the chip module, wherein the operation portion of the pair of levers is disposed on opposing sides of the frame and being rotatively displaced in opposing directions to respectively apply the downward force to opposing ends of the chip module and thereby press electrical contacts of the chip module into respective contact with the plurality of contacts in the slots of the housing; and at least one metallic orientation member inserted and secured to the frame to orient and pivotally couple the shaft portion of the levers at a first end portion thereof, wherein each metallic orientation member has an opposing second end portion adapted for soldering to a circuit board wherein the frame has an upwardly facing orientation border formed on each of two opposing ends thereof, each orientation border having a receiving slot formed therethrough with the metallic orientation member being inserted and secured within the receiving slot of each orientation border to orient and pivotally couple the shaft portion.

2. The electrical connector as claimed in claim 1, wherein each metallic orientation member has the first end portion folded inwardly in order to retain the shaft portion of a corresponding lever within a respective orientation border.

3. The electrical connector as claimed in claim 1, wherein the second end portion of each metallic orientation member is soldered to an upper surface of the circuit board, or penetrates through the circuit board for soldering to a lower surface thereof.

4. The electrical connector as claimed in claim 3, wherein each of the plurality of contacts has a lower end adapted for soldering to the upper surface of the circuit board, or each of the plurality of contacts has a lower end shaped like a needle for penetrating through the circuit board in order to solder to the lower surface thereof.

5. The electrical connector as claimed in claim 1, wherein a slit extending transversely with respect to the receiving slot, a respective metallic orientation member being inserted and secured within the receiving slot and extending into the slit, the first end portion of each metallic orientation member having a through hole formed therein through which the shaft portion of a corresponding lever passes for retention thereof and the opposing second end portion passing through the receiving slot and being soldered to a circuit board.

* * * * *